(12) United States Patent
Shimobe et al.

(10) Patent No.: US 9,379,051 B2
(45) Date of Patent: Jun. 28, 2016

(54) SEMICONDUCTOR DEVICE

(75) Inventors: Yasuo Shimobe, Tokyo (JP); Ryuichi Murayama, Tokyo (JP); Keiji Mitote, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 21 days.

(21) Appl. No.: 14/119,732

(22) PCT Filed: May 24, 2012

(86) PCT No.: PCT/JP2012/063270
§ 371 (c)(1),
(2), (4) Date: Nov. 22, 2013

(87) PCT Pub. No.: WO2012/165273
PCT Pub. Date: Dec. 6, 2012

(65) Prior Publication Data
US 2015/0194376 A1 Jul. 9, 2015

(30) Foreign Application Priority Data
May 27, 2011 (JP) .................. 2011-119606

(51) Int. Cl.
*H01L 23/495* (2006.01)
*H01L 23/31* (2006.01)
(Continued)

(52) U.S. Cl.
CPC ............. *H01L 23/49579* (2013.01); *C09J 9/00* (2013.01); *C09J 11/04* (2013.01); *H01L 23/3107* (2013.01);
(Continued)

(58) Field of Classification Search
None
See application file for complete search history.

(56) References Cited

U.S. PATENT DOCUMENTS 4,803,543 A 2/1989 Inayoshi et al.
5,990,516 A * 11/1999 Momose et al. ............... 257/327
(Continued)

FOREIGN PATENT DOCUMENTS

EP 1 156 520 A1 11/2001
JP 2002-118081 A 4/2002
(Continued)

OTHER PUBLICATIONS

International Search Report Issued in PCT/JP2012/063270, mailed on Sep. 11, 2012.
(Continued)

*Primary Examiner* — Anthony Ho
*Assistant Examiner* — Kevin Quinto
(74) *Attorney, Agent, or Firm* — Birch, Stewart, Kolasch & Birch, LLP

(57) ABSTRACT

According to the present invention, a semiconductor having excellent yield is provided. The semiconductor device (10) of the present invention includes:
a base material (die pad) (2), a semiconductor element (3), and an adhesive layer (1) intervening the space between the base material and the semiconductor element (3) to adhere the base material and the semiconductor element. Thermal conductive filler (8) is contained in the adhesive layer (1), and when the content of the thermal conductive filler dispersed in the whole of the adhesive layer is expressed as C, the content of the thermal conductive filler in the region 1 ranging from the interface of the adhesive layer at the side of the semiconductor element to the depth by 2 μm is expressed as C1, and the content of the thermal conductive filler in the region 2 ranging from the interface of the adhesive layer at the side of the base material to the depth by 2 μm is expressed as C2, the following formulae are satisfied:

$C1 < C$, and $C2 < C$.

10 Claims, 2 Drawing Sheets

(51) Int. Cl.
*H01L 23/00* (2006.01)
*C09J 9/00* (2006.01)
*C09J 11/04* (2006.01)
*H01L 23/367* (2006.01)
*H01L 23/498* (2006.01)
*C08K 3/08* (2006.01)
*H01L 23/373* (2006.01)
*H01L 21/683* (2006.01)

(52) U.S. Cl.
CPC ........ *H01L 23/367* (2013.01); *H01L 23/49513* (2013.01); *H01L 23/49816* (2013.01); *H01L 23/49894* (2013.01); *H01L 24/29* (2013.01); *H01L 24/32* (2013.01); *C08K 3/08* (2013.01); *C08K 2003/0806* (2013.01); *H01L 21/6836* (2013.01); *H01L 23/3737* (2013.01); *H01L 24/73* (2013.01); *H01L 24/83* (2013.01); *H01L 2221/68327* (2013.01); *H01L 2221/68377* (2013.01); *H01L 2224/2741* (2013.01); *H01L 2224/27436* (2013.01); *H01L 2224/2929* (2013.01); *H01L 2224/29311* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29386* (2013.01); *H01L 2224/29439* (2013.01); *H01L 2224/3224* (2013.01); *H01L 2224/3226* (2013.01); *H01L 2224/32225* (2013.01); *H01L 2224/32245* (2013.01); *H01L 2224/32501* (2013.01); *H01L 2224/48091* (2013.01); *H01L 2224/48247* (2013.01); *H01L 2224/48465* (2013.01); *H01L 2224/73265* (2013.01); *H01L 2224/83192* (2013.01); *H01L 2224/83862* (2013.01); *H01L 2924/01014* (2013.01); *H01L 2924/05432* (2013.01); *H01L 2924/05442* (2013.01); *H01L 2924/10253* (2013.01); *H01L 2924/12042* (2013.01); *H01L 2924/15311* (2013.01); *H01L 2924/15747* (2013.01)

(56) References Cited

U.S. PATENT DOCUMENTS

| | | |
|---|---|---|
| 6,177,722 B1 * | 1/2001 | Kovats et al. ................ 257/690 |
| 6,638,865 B2 | 10/2003 | Tanaka |
| 6,926,796 B1 * | 8/2005 | Nishida et al. ................ 156/312 |
| 2006/0165978 A1 | 7/2006 | Ito et al. |
| 2007/0172990 A1 | 7/2007 | Abdo et al. |

FOREIGN PATENT DOCUMENTS

| | | |
|---|---|---|
| JP | 2003-82034 A | 3/2003 |
| JP | 2009-152501 A | 7/2009 |
| TW | 200737373 | 10/2007 |
| WO | WO 2006/039294 A1 | 4/2006 |

OTHER PUBLICATIONS

Extended European Search Report, dated Feb. 10, 2015, for European Application No. 12793073.3 is provided.
First Office Action issued Sep. 3, 2015, in Taiwan Patent Application No. 101118325, with English translation.

* cited by examiner

SEMICONDUCTOR DEVICE

TECHNICAL FIELD

The present invention relates to a semiconductor device.

The present application claims priority on the basis of Japanese Patent Application No. 2011-119606, filed in Japan on May 27, 2011, the contents of which are incorporated herein by reference.

BACKGROUND ART

The technique which uses an adhesive film as a technique connecting a semiconductor element on a leadframe is known.

For example, this kind of technique is disclosed in Patent Document 1.

As for the adhesive film disclosed in Patent Document 1, it is described that a film which contains silver filler in a thermosetting resin is used.

Patent Document 1: Japanese Unexamined Patent Application No. 2002-118081

Patent Document 2: Japanese Unexamined Patent Application No. 2003-82034

Problem to be Solved by the Invention

However, the inventors examined and as a result, it is proved that the conventional adhesive film has room of improvement in the stress relaxation ability between a semiconductor element and another member.

DISCLOSURE OF INVENTION

Patent Document 2 discloses that in a silver paste adhesive, silver filler present at upper portion moves downwardly due to sinking of silver filler, and as a result, the distribution of silver filler becomes uneven.

According to Patent Document 2, it is disclosed that in an adhesive layer consisting of paste, the concentration of the silver filler increases from the upper surface to the bottom surface, and as a result, the adhesive force significantly decreases at the bottom surface.

Thus, in the field of the present invention, it has been required to reduce the decreasing of adhesive force at the bottom surface of the adhesive layer. It has been thought that in order to satisfy such a requirement, the adhesive layer film that is pressure welded between a semiconductor element and a leadframe, preferably has perfectly uniform silver filler distribution in its thickness direction.

However, as a result that the inventors examined, in the case in which silver filler was distributed completely uniform, it is proved that stress relaxation ability in an interface of an adhesive layer film cannot be obtained sufficiently.

As a result that the inventors further examined, it was found that in the adhesive layer consisting of die attach paste (which may be called as DA layer, below), non-uniform distribution of silver filler generates in a thickness direction of layer.

Although its mechanism is uncertain, if a die attach paste is pressed from both sides, then flowing of resin differs in the inner portion and the outer portion of the paste. From this, it can be presumed that the concentration of silver filler increases in the inner portion of the DA layer, whereas the concentration of resin increases in both interfaces of the DA layer. Thereby, stress relaxation ability at the both interfaces of the DA layer increases.

As a result of examination, it is found that an item having the following constitution is desirable.

In other words, the present invention provides:

[1] A semiconductor device, comprising:
a base material,
a semiconductor element, and
an adhesive layer intervening the space between the base material and the semiconductor element to adhere the base material and the semiconductor element, wherein thermal conductive filler is dispersed in the adhesive layer, and when the content of the thermal conductive filler dispersed in the whole of the adhesive layer is expressed as C,
the content of the thermal conductive filler in the region 1 ranging from the interface of the adhesive layer at the side of the semiconductor element to the depth by 2 μm is expressed as C1, and
the content of the thermal conductive filler in the region 2 ranging from the interface of the adhesive layer at the side of the base material to the depth of 2 μm is expressed as C2, the following formulae are satisfied:

$C1 < C$, and $C2 < C$.

In addition, the present invention includes the following.

[2] The semiconductor device as set forth in [1], wherein the following formulae are satisfied:

$0.75 < C1/C < 0.97$, and $0.75 < C2/C < 0.97$.

[3] The semiconductor device as set forth in [1] or [2], wherein the thermal conductive filler contains at least one kind of particle selected from the group consisting of silver, copper, gold, aluminum, nickel, alumina and silica.

[4] The semiconductor device as set forth in any one of [1] to [3], wherein the base material is leadframe, a heat sink or a BGA substrate.

[5] The semiconductor device as set forth in any one of [1] to [4], wherein the semiconductor element is a power device having electric power consumption of 1.7 W or more.

Effect of the Invention

According to the present invention, provided is a semiconductor device which excels in yield.

BEST MODE FOR CARRYING OUT THE INVENTION

Figure 1:
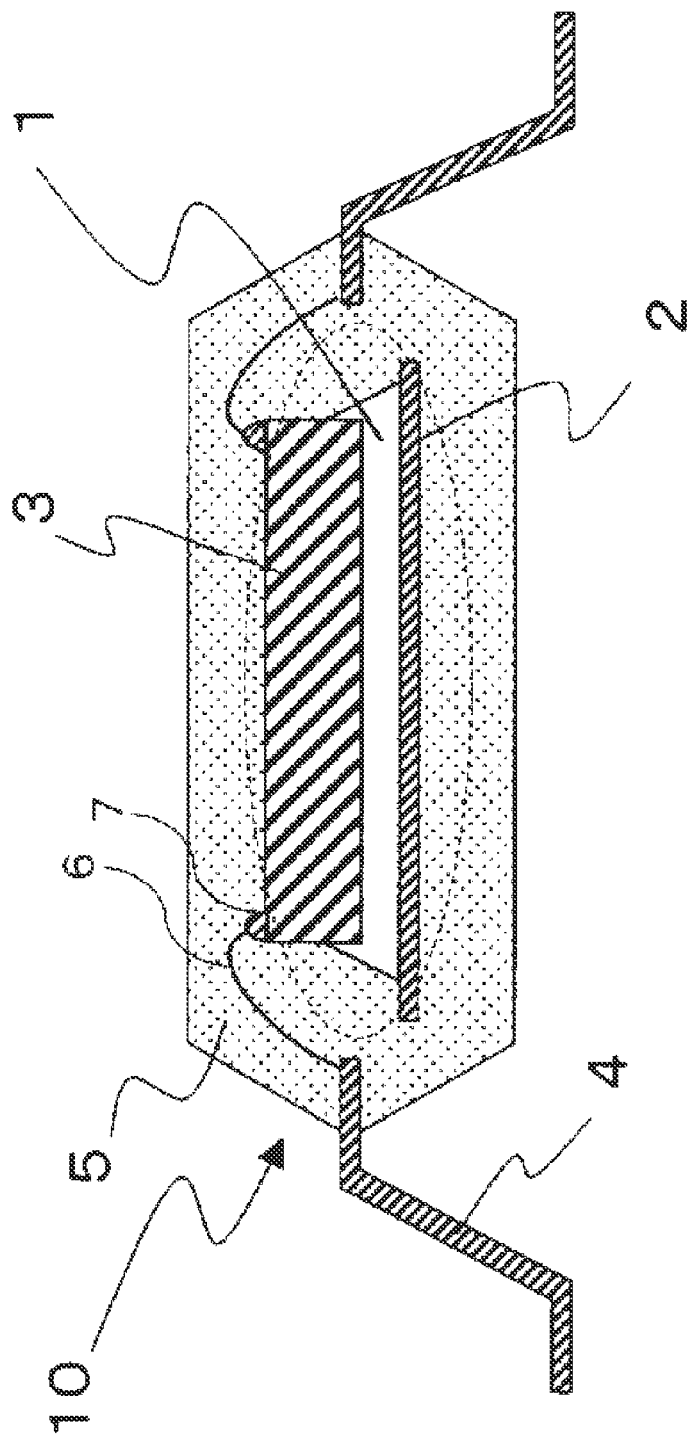
FIG. 1 is a cross-sectional view showing the constitution of the semiconductor device with regard to the present embodiment.

One embodiment according to the present invention will be explained below, referring to the drawings. It should be noted that the same reference is attached to the same constitutional element, and explanation thereof may be omitted appropriately.

FIG. 1 is a cross-sectional view showing the constitution of the semiconductor device 10 of this embodiment.

Figure 2:
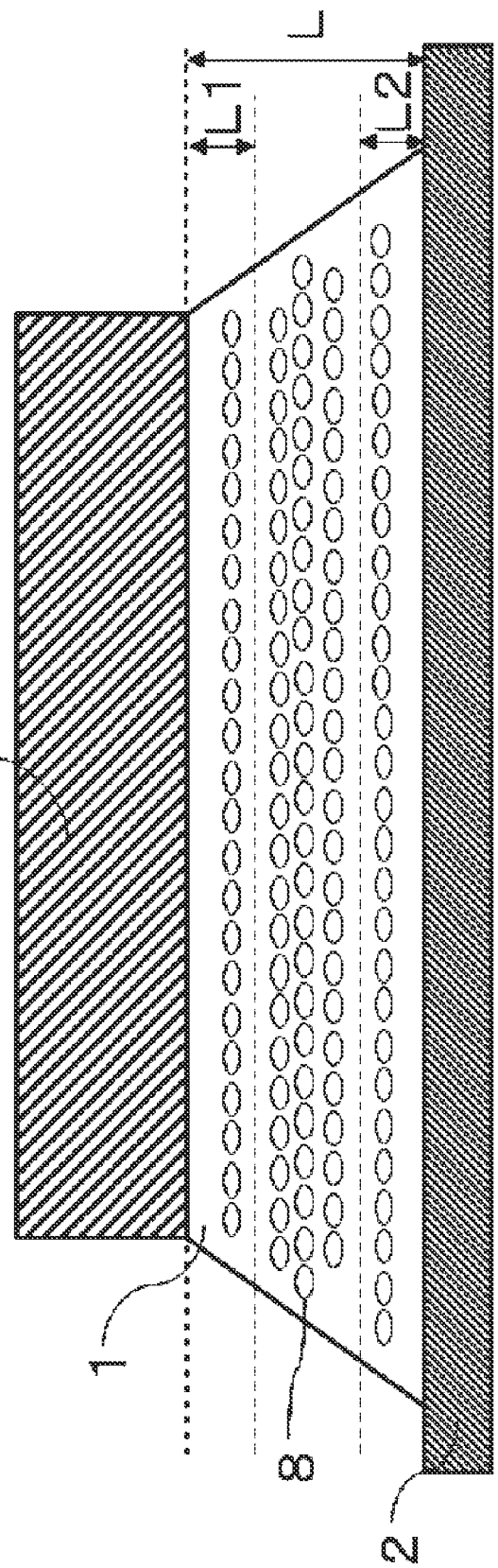
FIG. 2 is an enlarged view of the semiconductor device shown in FIG. 1.

FIG. 2 is a drawing showing enlarged view of a part of the semiconductor device 10 shown in FIG. 1.

The semiconductor device 10 of this embodiment has the base material (die pad 2), the semiconductor element 3, and the adhesive layer 1 intervening the space between the base material and the semiconductor element 3 to adhere the base material and the semiconductor element. The adhesive layer 1 contains the thermal conductive filler 8. In the semiconductor device 10, the thermal conductive filler 8 is dispersed in the adhesive layer 1, and when the content of the thermal conductive filler 8 dispersed in the entirely of the adhesive layer 1 is expressed as C, the content of the thermal conductive filler 8 in the region 1 ranging from the interface of the adhesive layer 1 at the side of the semiconductor element 3 to a depth of 2 μm is expressed as C1, and the content of the thermal conductive filler 8 in the region 2 ranging from the interface of the adhesive layer 1 at the side of the base material (the die pad 2) to a depth of 2 μm is expressed as C2, the following formulae are satisfied:

$$C1<C, \text{ and } C2<C.$$

It will be explained in detail below.

The adhesive layer 1 is formed by contact bonding a resin paste composition (die attach paste) explained later, with the semiconductor element 3 and the die pad 2.

The inventors of the present invention found that non-uniform distribution of the thermal conductive filler 8 such as silver filler generates in the direction of contact bonding (i.e. thickness direction of the layer) of the adhesive layer (which may be expressed simply as the adhesive layer 1) which is obtained by contact bonding the die attached paste along the opposed direction. Although the mechanism that thermal conductive filler 8 becomes uneven distribution is unexplained, it can be imagined as follows.

That is, when the die attached paste is pressed from both sides, the flow of resin differs in the inner portion and in the outer portion of the paste. Thereby, the concentration of the thermal conductive filler 8 in the inner portion of the adhesive layer 1 becomes higher than that of the interface. On the other hand, it can be thought that the concentration of the resin in both interfaces of the adhesive layer 1 becomes higher than that of the inner portion. Such an adhesive layer 1 can be specified by the formulae C1<C and C2<C. As a result of examination, it is found that the adhesive layer satisfying the condition as such excels in the stress relaxation ability in both interfaces.

Accordingly, since the semiconductor element 3 is protected by the adhesive layer 1 having stress relaxation ability upon being cured, the yield of the semiconductor device 10 increases.

Conventionally, as for distribution of silver filler in the adhesive layer, there are two ways as follows. The first one is that silver filler is distributed such that the concentration of the silver filler increases from the upper surface of the adhesive layer to the bottom surface. The second one is that silver filler is distributed such that the concentration of the silver filler is completely uniform from the upper surface of the adhesive layer to the bottom surface. In the first distribution, since the concentration of silver filler at the bottom surface of the adhesive layer becomes significantly high, the adhesive force at the bottom surface deteriorates. On the other hand, in the second distribution, since silver filler is distributed uniformly over the entirety of the adhesive layer, the stress relaxation ability at the interface of the adhesive layer film cannot be sufficiently obtained.

In contrast, according to this embodiment, the adhesive layer 1 is constituted such that the concentration of the thermal conductive filler 8 in the upper layer and the bottom layer is lower than that of the inner portion. Accordingly, the adhesive layer 1 can exhibit stress relaxation ability at both the upper interface and the bottom interface, as well as excellent adhesive properties.

In this embodiment, the adhesive layer 1 preferably satisfies the formulae 0.75<C1/C<0.97 and 0.75<C2/C<0.97. As a result of making each of C1/C and C2/C the upper limit thereof or less, thermal shrinkage decreases, and stress relaxation ability can be sufficiently exhibited. In addition, adhesive property can be sufficiently exhibited.

On the other hand, as a result of making each of C1/C and C2/C be the lower limit thereof or higher, the linear expansion coefficient decreases, thereby occurrence of cracks can be controlled. In addition, since the linear expansion coefficient can be increased, occurrence of camber in the adhesive layer 1 can be controlled. In other words, it is possible to obtain an adhesive layer 1 which excels in balance of the stress relaxation ability and crack resistance properties. In this embodiment, it is possible to adjust each of the values of C1 and C2, by selecting the material of the adhesive layer 1 appropriately and controlling the production method of the semiconductor device 10 appropriately.

As shown in FIG. 2, the upper surface of adhesive layer 1 is bonded to the bottom surface of the semiconductor element 3. The bottom surface of the adhesive layer 1 is bonded to the die pad 2. In a cross sectional view when it is looked in a placing direction of the semiconductor element 3 to the die pad 2, L1 denotes the depth from the interface at a side of the semiconductor element 3 of the adhesive layer 1. In addition, L2 denotes the depth from the interface of a side of the base material (die pad 2) of the adhesive layer 1, in the same cross sectional view. In addition, L denotes the film thickness of the whole adhesive layer 1, in the same cross sectional view.

It should be noted that the adhesive layer 1 may be formed so as to cover a part of the side wall as well as the bottom surface of the semiconductor element 3. In this case, each of L1, L2 and L is specified by, as above, the part of the adhesive layer 1 disposed to the space between the bottom surface of the semiconductor element 3 and the upper surface of the die pad 2. Each of L1, L2 and L can be calculated from the SEM cross sectional image of the adhesive layer 1.

In addition, in this embodiment, each of L1/L and L2/L is not particularly limited, but, for example, is preferably 1/10 or more to 1/5, and more preferably 1/8 to 1/6. As a result of making the ratio be the lower limit thereof or higher, it is possible to exhibit the stress relaxation ability sufficiently. On the other hand, as a result of making the ratio the upper limit thereof or less, occurrence of a crack can be suppressed.

In addition, in this embodiment, the total depth L of the adhesive layer 1 is not particularly limited, but, for example, is preferably 6 to 200 μm, and more preferably 8 to 100 μm. As a result of making the value the lower limit thereof or higher, it is possible to exhibit the stress relaxation ability sufficiently. On the other hand, as a result of making the value the upper limit thereof or less, occurrence of a crack can be suppressed.

As a calculation method of content of the thermal conductive filler 8, for example, the following method can be adopted. In other words, at first, a binarization process is performed on a scanning electron microscope cross-sectional image of the adhesive layer 1 in a thickness direction. In the binarization process, the threshold is set to the volume fraction X of the conductive filler contained in the cured product obtained from the ash measurement of cured product of paste. Subsequently, the binarized image obtained by the binarization process is divided in the thickness direction at 0.2 μm intervals, thereby calculating the content of thermal conductive filler 8 of each of the layers. This embodiment will be explained using silver filler as the thermal conductive filler 8. However, it can be calculated similarly when a different filler is used. Here, the calculation of the content is performed as follows. First, in order from the upper part to the lower part, the 1st layer, the 2nd layer, . . . the Nth layer are defined. On the other hand, it is defined as the 1'st layer, the 2'nd layer, . . . the N'th layer from the upper part to the lower part. Subsequently, (1) the content of the $1^{st}$ layer to the Nth layer from the upper part to the lower part is calculated. Thereafter, it is calculated, as the silver ratio of the 1st layer= (silver amount of the $1^{st}$ layer/X)×100, the silver ratio of from the $1^{st}$ layer to the $2^{nd}$ layer=(silver amount of the $1^{st}$ layer+ silver amount of the 2nd layer)/X×100, . . . , the silver ratio of from the $1^{st}$ layer to the Nth layer=(silver amount of the $1^{st}$ layer+silver amount of the $2^{nd}$ layer+ . . . +silver amount of the Nth layer)/X×100=(X/X)×100=100.

Similarly, (2) the content from the lower part to the upper part is calculated.

Thereafter, it is calculated, as the silver ratio of the 1'st layer=(silver amount of the 1'st layer/X)×100, the silver ratio of from the 1'st layer to the 2'nd layer=(silver amount of the 1'st layer+silver amount of the 2'nd layer)/X×100, . . . , the silver ratio of from the 1'st layer to the N'th layer= (silver amount of the 1'st layer+silver amount of the 2'nd layer+ . . . +silver amount of the N'th layer)X×100=(X/X)× 100=100.

From these numerical values, silver ratio of each of layers to the total amount of silver when changing the distance from the upper part and the lower part is calculated.

Thereafter, as for C1/C in the region 1 ranging from the interface at the semiconductor element 3 side to a depth of 2 nm of the adhesive layer 1, the silver ratio (1) which is calculated from the upper part to the lower part of the $10^{th}$ layer is adopted.

On the other hand, as for C2/C in the region 2 ranging from the interface at the base material (die pad 2) side to a depth of 2 μm of the adhesive layer 1, the silver ratio (2) which is calculated from the lower part to the upper part of the $10^{th}$ layer is adopted.

Thermal conductive filler 8 is contained in the adhesive layer 1. As for the thermal conductive filler 8, the material therefor is not limited particularly, besides particles of silver, copper, gold, aluminum, nickel, alumina, or silica, particles containing silver as a main component, metal particles such as copper, gold, nickel, palladium, tin or alloy particles thereof, and oxide particles such as alumina, silica on which silver is deposited can be used. As for the size of the thermal conductive filler 8, for example in the case in which it is in a spherical shape, the average diameter $D_{50}$ is not limited particularly, the average diameter $D_{50}$ ranges preferably from 0.05 μm to 20 μm, more preferably from 0.1 μm to 10 μm. Thereby dispersing performance of the filler is improved. Measuring method of the average particle size is not limited particularly. It should be noted that the average particle size can be measured by using, for example, a flow-type particle image analyzer, a particle size distribution measuring device using a laser diffraction/scattering method, In this embodiment, the base material (die pad 2) is not limited in particular, and various base material such as lead-frame, other semiconductor elements, an packaging board including a circuit board, a semiconductor wafer can be used.

Of these, since the adhesive layer 1 can radiate heat, a leadframe, a heat sink or a BGA substrate is preferred.

In addition, of these, since the adhesive layer 1 will be able to exhibit excellent stress relaxation ability, the other semiconductor elements are also preferable. Of these, since the adhesive layer 1 can be usable as a film for use in dicing, a semiconductor wafer is also preferable.

In addition, the semiconductor element 3 is not limited particularly, for example, it is preferable to be a power device having electrical power consumption of 1.7 W or more. The semiconductor element 3 is electrically connected to the lead 4 through the pad 7 and the bonding wire 6. In addition, the circumference of the semiconductor element 3 is sealed by sealing material layer 5.

Next, it will be explained with respect to a resin paste composition to be used for the adhesive layer 1, below.

In this embodiment, for example, the adhesive layer 1 is obtained by, for example, curing a thermosetting resin composition. As the thermosetting resin composition, those including a general thermosetting resin which forms a network structure of a three dimension by heating is preferred. The thermosetting resin is not limited particularly, it is preferable to be material which forms a liquid resin composition, and it is desirable to be a liquid at a room temperature (25° C.). For example, cyanate resin, an epoxy resin, radical polymerizable acrylic resin, and maleimide resin are exemplary. The thermosetting adhesive composition may contain various additives such as a curing agent, curing accelerant, polymerization initiator, depending on object.

Cyanate resin is a compound having —NCO group in the molecule, and a resin which forms a network structure of a three dimension since the —NCO group reacts by heating to be cured. Specifically, 1,3-dicyanate benzene, 1,4-dicyanate benzene, 1,3,5-tricyanate benzene, 1,3-dicyanate naphthalene, 1,4-dicyanate naphthalene, 1,6-dicyanate naphthalene, 1,8-dicyanate naphthalene, 2,6-dicyanate naphthalene, 2,7-dicyanate naphthalene, 1,3,6-tricyanate naphthalene, 4,4'-dicyanate biphenyl, his (4-cyanate phenyl)methane, his (3,5-dimethyl-4-cyanate phenyl)methane, 2,2-bis(4-cyanate phenyl)propane, 2,2-bis (3,5-dibromo-4-cyanate phenyl)propane, bis(4-cyanate phenyl)ether, bis(4-cyanate phenyl) thioether, bis(4-cyanate phenyl) sulfone, tris (4-cyanate phenyl) phosphite, tris (4-cyanate phenyl) phosphate and cyanates obtainable from reaction of novolac resin and halogenation cyan are exemplary, and prepolymer having triazine ring formed by trimerizing the cyanate group of these multifunctional cyanate resins can be also used. This prepolymer is obtained by polymerizing the multifunctional cyanate resin monomer using, for example, acids such as mineral acid, Lewis acid, bases such as sodium alcoholate, tertiary amine, salts such as sodium carbonate, as catalyst.

As a curing accelerant for the cyanate resin, those known well can be used generally. For example, organic metal complex such as zinc octoate, tin octoate, cobalt naphthenate, zinc naphthenate, acetylacetone iron, metal salts such as aluminum chloride, tin chloride, zinc chloride, and amines such as triethylamine, dimethyl benzylamine are exemplary, but is not limited thereto.

These curing accelerants can be used alone or as a mixture of two or more thereof. In addition, cyanate resin can be used together with other resin such as an epoxy resin, oxetane resin, acrylic resin, and maleimide resin.

Epoxy resin is a compound which has one or more of glycidyl group in the molecule, which forms a network structure of a three dimension by reacting the glycidyl group with heat to be cured. It is preferable that two or more of glycidyl groups are contained in one molecule, because even if a compound having only one glycidyl group is reacted, sufficient cured product properties cannot be obtained.

As the compound which has two or more of glycidyl groups in one molecule, bifunctional compounds obtained by epoxidation of bisphenol compounds such as bisphenol A, bisphenol F, biphenol and derivatives thereof, diols having alicyclic structure such as hydrogenated bisphenol A, hydrogenated bisphenol F, hydrogenated biphenol, cyclohexanediol, cyclohexanedimethanol, cyclohexanediethanol, and derivatives thereof, aliphatic diols such as butanediol, hexanediol, octanediol, nonanediol, decanediol or derivatives thereof; trifunctional compounds having trihydroxyphenylmethane skeleton, aminophenol skeleton; and multifunctional compounds obtained by epoxidation of phenol novolac resin, cresol novolac resin, phenol aralkyl resin having phenylene skeleton, phenol aralkyl resin having biphenylene skeleton, and naphthol aralkyl resin having phenylene skeleton are exemplary, but it is not limited thereto. In addition, since it is necessary to be liquid at a room temperature as a resin composition, those which are liquid at a room temperature as alone or mixture are preferable. It is also possible to use reactive diluent, as usual. As reactive diluent, monofunctional aromatic glycidyl ethers such as phenyl glycidyl ether, and cresyl glycidyl ether, and aliphatic glycidyl ether are exemplary. A curing agent is used for the purpose of curing the epoxy resin.

As a curing agent of the epoxy resin, for example, aliphatic amine, aromatic amine, dicyandiamide, dihydrazide compound, acid anhydride, and a phenol resin are exemplary.

As a dihydrazide compound, carboxylic acid dihydrazides such as adipic acid dihydrazide, dodecanoic acid dihydrazide, isophthalic acid dihydrazide, and p-oxy benzoic acid dihydrazide are exemplary, as acid anhydrides, phthalic acid anhydride, tetrahydro phthalic anhydride, hexahydro phthalic anhydride, endomethylene tetrahydro phthalic acid anhydride, dodecenyl succinic acid anhydride, maleic anhydride, a reactant of a polybutadiene and maleic anhydride, and a copolymer of maleic anhydride and styrene are exemplary.

As a phenol resin which is used as a curing agent of epoxy resin, it is necessary to be a compound having two or more of phenolic hydroxyl groups in one molecule.

Compounds having one phenolic hydroxyl group in one molecule cannot have a crosslinked structure thereby deteriorating cured product properties, hence such a compound cannot be used. In addition, compounds having two or more of hydroxyl groups in one molecule can be used, the number of the phenolic hydroxyl groups preferably ranges from 2 to 5.

If the number is larger than this range, then the molecular weight increases too much, such that the viscosity of the electric conductive paste increases too much, and hence it is not preferable.

More preferable number of phenolic hydroxyl group contained in one molecule is 2 or 3. As such a compound, bisphenols such as bisphenol F, bisphenol A, bisphenol S, tetramethyl bisphenol A, tetramethyl bisphenol F, tetramethyl bisphenol S, dihydroxy diphenyl ether, dihydroxy benzophenone, tetra methyl biphenol, ethylidene bisphenol, methylethylidene bis (methyl phenol), cyclohexylidene bisphenol, biphenol, and derivatives thereof; trifunctional phenols such as tri (hydroxyphenyl) methane, tri (hydroxyphenyl)ethane, and derivatives thereof compound obtained by reacting phenols such as phenol novolac, cresol novolac, with formaldehyde and mainly consisting of dimer or trimer and derivatives thereof are exemplary.

As a curing accelerant of epoxy resin, imidazoles, salts of triphenylphosphine or tetraphenylphosphonium, amine type compounds such as diazabicycloundecene and salts thereof are exemplary, imidazole compounds such as 2-methylimidazole, 2-ethylimidazole-2-phenylimidazole, 2-phenyl-4-methylimidazole, 2-phenyl-4-methyl-5-hydroxymethylimidazole, 2-phenyl-4,5-dihydroxymethylimidazole, 2-$C_{11}H_{23}$-imidazole, and an adduct of 2-methylimidazole and 2,4-diamino-6-vinyltriazine are used favorably. Of these, particularly preferred one is imidazole compounds having melting point of 180° C. or higher. In addition, an epoxy resin is desirable to be used with cyanate resin, acrylic resin, and maleimide resin.

Radical polymerizable acrylic resin is a compound having (meth)acryloyl groups in the molecule, which forms a network structure of a three dimension by reacting (meth)acryloyl groups to be cured.

In the molecule, one or more of (meth)acryloyl groups have to be contained, two or more of (meth)acryloyl groups preferably be contained.

Particularly preferable acrylic resin is a compound having molecular weight ranging from 500 to 10000, of polyether, polyester, polycarbonate, poly(meth)acrylate, having (meth)acrylic groups.

As a polyether, those having organic groups of 3 to 6 carbon atoms repeating through ether linkage are preferred and those having no aromatic rings are preferred. They can be obtained by reacting polyetherpolyols with (meth)acrylic acid or derivative thereof. As a polyester, those having organic groups of 3 to 6 carbon atoms repeating through ester linkage are preferred and those having no aromatic rings are preferred. They can be obtained by reacting polyesterpolyols with (meth)acrylic acid or derivative thereof. As a polycarbonate, those having organic groups of 3 to 6 carbon atoms repeating through carbonate linkage are preferred and those having no aromatic rings are preferred. They can be obtained by reacting polycarbonatepolyols with (meth)acrylic acid or derivative thereof.

As a poly (meth) acrylate, copolymers of (meth)acrylic acid and (meth)acrylate or copolymers of (meth)acrylate having polar groups and (meth)acrylate having no polar groups are preferred. In the case of reacting these copolymers with carboxyl groups, acrylate having hydroxyl groups are used, whereas in the case of reacting these copolymers with hydroxyl groups, (meth)acrylic acid or derivative thereof are used to obtain.

If necessary, the following compounds can be used together. For example, (meth)acrylate having hydroxyl groups such as 2-hydroxy ethyl (meth) acrylate, 2-hydroxy propyl (meth) acrylate, 3-hydroxy propyl (meth) acrylate, 2-hydroxy butyl (meth) acrylate, 3-hydroxy butyl (meth) acrylate, 4-hydroxy butyl (meth) acrylate, 1,2-cyclohexanediol mono(meth)acrylate, 1,3-cyclohexanediol mono (meth)acrylate, 1,4-cyclohexanediol mono(meth)acrylate, 1,2-cyclohexanedimethanol mono(meth)acrylate, 1,3-cyclohexanedimethanol mono(meth) acrylate, 1,4-cyclohexanedimethanol mono(meth)acrylate, 1,2-cyclohexanediethanol mono(meth)acrylate, 1,3-cyclohexanediethanol mono (meth)acrylate, 1,4-cyclohexane diethanol mono(meth) acrylate, glycerin mono(meth)acrylate, glycerin di(meth) acrylate, trimethylolpropane mono(meth)acrylate, trimethylolpropane di(meth) acrylate, pentaerythritol mono (meth) acrylate, pentaerythritol di(meth)acrylate, pentaerythritol tri (meth)acrylate, and neopentylglycol mono(meth)acrylate; or (meth)acylate having carboxyl groups obtained by reacting these (meth)acrylate having hydroxyl group with dicarboxyl groups or derivatives thereof are exemplary. As a dicarboxylic acid which can be used here, for example, an oxalic acid, a malonic acid, a succinic acid, a glutaric acid, an adipic acid, a pimelic acid, a suberic acid, an azelaic acid, a sebacic acid, a maleic acid, a fumaric acid, a phthalic acid, a tetrahydrophthalic acid, a hexahydrophthalic acid and derivatives thereof are exemplary.

Besides aforementioned compounds, methyl(meth)acrylate, ethyl(meth)acrylate, n-butyl(meth)acrylate, isobutyl (meth)acrylate, tert-butyl(meth)acrylate, isodecyl (meth) acrylate, lauryl(meth)acrylate, tridecyl(meth)acrylate, cetyl (meth)acrylate, stearyl(meth)acrylate, isoamyl(meth) acrylate, iso-stearyl(meth)acrylate, behenyl (meth)acrylate, 2-ethylhexyl(meth)acrylate, other alkyl(meth)acrylates, cyclohexyl (meth)acrylate, tert-butylcyclohexyl(meth)acrylate, tetrahydrofurfuryl(meth) acrylate, benzyl(meth)acrylate, phenoxyethyl(meth)acrylate, isobornyl(meth) acrylate, glycidyl (meth)acrylate, trimethylolpropane tri(meth)acrylate, zinc mono (meth)acrylate, zinc di(meth)acrylate, dimethylaminoethyl(meth)acrylate, diethylaminoethyl(meth) acrylate, neopentyl glycol(meth)acrylate, trifluoroethyl (meth)acrylate, 2,2,3,3-tetrafluoropropyl(meth)acrylate, 2,2,3,3,4,4-hexafluorobutyl (meth)acrylate, perfluorooctyl (meth)acrylate, perfluorooctylethyl(meth)acrylate, ethyleneglycol di(meth)acrylate, propyleneglycol di(meth) acrylate, 1,4-butanedioldi (meth)acrylate, 1,6-hexanediol di(meth)acrylate, 1,9-nonandiol di(meth)acrylate, 1,3-butanediol di(meth)acrylate, 1,10-decanediol di(meth)acrylate, tetramethylene glycol di(meth)acrylate, methoxyethyl(meth) acrylate, butoxyethyl(meth)acrylate, ethoxydiethyleneglycol (meth)acrylate, methoxypolyalkyleneglycol mono(meth) acrylate, octoxypolyalkyleneglycol mono(meth)acrylate, lauroxy polyalkyleneglycol mono(meth)acrylate, stearoxypolyalkyleneglycol mono(meth)acrylate, allyloxypoly alkyleneglycol mono(meth)acrylate, nonylphenoxypolyalkyleneglycol mono(meth) acrylate, N,N'-methylene bis(meth) acrylamide, N,N'-ethylene bis(meth)acrylamide, 1,2-di (meth)acrylamide ethyleneglycol, di(meth)acryloyloxy methyl tricyclodecane, N-(meth)acryloyloxy ethyl maleimide, N-(meth)acryloyloxy ethyl hexahydro phthalimide, N-(meth)acryloyloxy ethyl phthalimide, n-vinyl-2-pyrolidone, styrene derivatives, and α-methyl styrene derivatives can be used.

Further, a thermal radical polymerization initiator is further used favorably as a polymerization initiator.

Those usually used as a thermal radical polymerization initiator, are not limited particularly. Preferred is those having decomposition temperature in the flash heating examination (decomposition starting temperature when sample in an amount of 1 g is placed on an electrical hot plate, and heated at a rate of 4° C./minute) ranging from 40 to 140° C. If the decomposition temperature is less than 40° C., then the storage life of the electrical conductive paste at an atmospheric temperature deteriorates, whereas the decomposition temperature is more than 140° C., then the curing time becomes long too much, and hence it is not favorable.

As a thermal radical polymerization initiator satisfying this condition, specifically, methyl ethyl ketone peroxide, methyl cyclohexanone peroxide, methyl aceto acetate per oxide, acetylacetone peroxide, 1,1-bis(t-butyl peroxy)3,3,5-trimethyl cyclohexane, 1,1-bis(t-hexyl peroxy)cyclohexane, 1,1-bis(t-hexyl peroxy)3,3,5-trimethyl cyclohexane, 1,1-bis(t-butyl peroxy)cyclohexane, 2,2-bis(4,4-di-t-butyl peroxy cyclohexyl) propane, 1,1-bis(t-butyl peroxy) cyclo dodecane, n-butyl, 4,4-bis (t-butyl peroxy)valerate, 2,2-bis (t-butyl peroxy)butane, 1,1-bis (t-butyl peroxy)-2-methyl cyclohexane, t-butylhydroper oxide, P-menthanehydroperoxide, 1,1,3,3-tetramethyl butyl hydroperoxides, t-hexyl hydro peroxide, dicumyl peroxide, 2,5-dimethyl-2,5-bis (t-butyl peroxy)hexane, α, α'-bis (t-butyl peroxy)diisopropyl benzene, t-butyl cumyl peroxide, di-t-butyl peroxide, 2,5-dimethyl-2,5-bis(t-butyl peroxy)hexyne-3, isobutyryl peroxide, 3,5,5-trimethyl hexanoyl peroxide, octanoyl peroxide, lauroyl peroxide, cinnamic acid per oxide, m-toluoyl peroxide, benzoyl peroxide, diisopropyl peroxydicarbonate, bis(4-t-butyl cyclohexyl) peroxydicarbonate, di-3-methoxy butyl peroxydicarbonate, di-2-ethyl hexyl peroxy dicarbonate, di-sec-butyl peroxy dicarbonate, di(3-methyl-3-methoxy butyl) peroxy dicarbonate, di (4-t-butyl cyclohexyl) peroxy dicarbonate, α, α'-bis (neo-decanoyl peroxy) diisopropyl benzene, cumyl peroxyneodecanoate, 1,1,3,3,-tetramethylbutylperoxyneodecanoate, 1-cyclohexyl-1-methylethylperoxyneodecanoate, t-hexylperoxyneodecanoate, t-butyl peroxy neodecanoate, t-hexyl peroxypivalate, t-butyl peroxy pivalate, 2,5-dimethyl-2,5-bis (2-ethyl hexanoyl peroxy)hexane, 1,1,3,3-tetramethyl butyl peroxy-2-ethyl hexanoate, 1-cyclohexyl-1-methylethyl peroxy-2-ethyl hexanoate, t-hexyl peroxy-2-ethyl hexanoate, t-butyl peroxy-2-ethyl hexanoate, t-butyl peroxy isobutylate, t-butylperoxymaleic acid, t-butyl peroxy laurate, t-butyl peroxy-3,5,5-trimethyl hexanoate, t-butyl peroxy isopropyl monocarbonate, t-butyl peroxy-2-ethyl hexyl mono carbonate, 2,5-dimethyl-2,5-bis(benzoyl peroxy)hexane, t-butyl peroxy acetate, t-hexyl peroxy benzoate, t-butyl peroxy-m-toluoyl benzoate, t-butyl peroxy benzoate, bis(t-butyl peroxy)isophthalate, t-butyl peroxy allyl monocarbonate, and 3,3',4,4'-tetra(t-butyl peroxy carbonyl)benzophenone are exemplary. Each of these can be used alone or as a mixture of two or more thereof, in order to control curing ability.

In addition, the above mentioned radical polymerizable acrylic resin is preferably used together with cyanate resin, epoxy resin, maleimide resin.

Maleimide resin is a compound which has one or more of maleimide group in one molecule, which forms a network structure of a three dimension by reacting maleimide group with heat to be cured.

For example, bismaleimide resin such as N,N'-(4,4'-diphenyl methane)bismaleimide, bis (3-ethyl-5-methyl-4-maleimide phenyl)methane, and 2,2-bis[4-(4-maleimide phenoxy) phenyl]propane are exemplary.

More preferred maleimide resin is a compound obtained by the reaction of a dimer acid diamine and a maleic anhydride, and a compound obtained by the reaction of maleimide amino acids such as maleimide acetic acid and a maleimide caproic acid, with polyol. Maleimide amino acid is obtained by reacting maleic anhydride and aminoacetic acid or an aminocapronic acid. As a polyol, polyether polyol, polyester polyol, polycarbonate polyol, and poly(meth)acrylate polyol are preferred, and those having no aromatic rings are particularly preferred.

Maleimide group is desirable to be used together with allyl ester resin, because maleimide group is reactive with allyl group.

As an allyl ester resin, an aliphatic one is preferred, and particularly preferable is a compound obtained by interesterification of cyclohexane diallyl ester and aliphatic polyols.

Number average molecular weight of the allyl ester type compound is not limited particularly, it ranges preferably from 500 to 10000, particularly preferably from 500 to 8000.

If the number average molecular weight is within the range, then it is possible to reduce hardening shrinkage particularly, to prevent adhesion from deteriorating. In addition, it is also preferable to be used together with cyanate resin, epoxy resin, acrylic resin.

The other additives may be used for the thermosetting resin composition, if necessary. As the other additive, silane coupling agents such as epoxy silane, mercapto silane, amino silane, alkyl silane, ureido silane, vinyl silane, and sulfide silane; coupling agents such as titanate coupling agent, aluminium coupling agent, and aluminium/zirconium coupling agent; colorants such as carbon black; solid stress-reducing components such as silicone oil, and silicone rubber; inorganic ionic exchangers such as hydro talcite, anti-foamant, a surface activating agent, various polymerization inhibitor, an antioxidant are exemplary, and various of additives may be compounded appropriately. Each of these compounds may be used alone or in combination of two or more thereof.

The method of using the thermosetting adhesive composition used in the production method of semiconductor device of this embodiment will be explained below, referring to specific examples.

In the embodiment, in the case in which the thermosetting adhesive composition used in the production method of the semiconductor device is a liquid adhesive, after preliminarily mixing the afore-mentioned various components, the resultant mixture is kneaded using a three-roll mill, thereafter the resultant kneaded product is subjected to a vacuum deaeration to obtain a liquid adhesive. The resultant liquid adhesive is applied to, for example, predetermined portions of a substrate (in particular a leadframe) using a commercially available die-bonder, and then a semiconductor element is mounted thereon and heated to cure the adhesive. Thereafter, wire-bonding is performed thereon, and then transfer-molding is effected thereon using a sealing resin which mainly consists of epoxy resin to obtain a semiconductor device.

It should be noted that a film-shaped adhesive can be used by the same way as above. In this case, for example, the film-shaped adhesive is laminated on a supporting member, and then the resultant laminated adhesive is processed by the same way as above to obtain a semiconductor device.

EXAMPLE

The present invention will be explained below, using embodiments concretely, but the present invention is not limited thereto.

A compound ratio represents are shown in terms of parts by weight.

In both the Example and Comparative Example, the following materials were compounded in parts by weight shown in Table 1, and then the resultant mixture was kneaded and deaerated using a three-roll mill to obtain a resin composition.
(Evaluation Test)

The following evaluation tests were conducted on the resultant resin composition obtained in the Examples and Comparative Examples, respectively.

Evaluation result is shown in Table 1.
(Precipitation Test)

Syringes (10 cc) filled with each of the resin compositions of Examples in an amount of 30 g were stored such that the tip of syringe turns to the bottom, for 30 days in a temperature controlled bath adjusted at 0° C.

The appearance of the test sample (the content of the syringe) after storing was confirmed by visual observation, and the test sample having no change was graded as ○, the test sample showing a little separation between the silver powder and the resin composition was graded as Δ, and the test sample showing a significant separation between the silver powder and the resin composition was graded as x.
(Reflow Resistance)

Using each of the resin compositions of Examples and Comparative Examples, the following leadframe and silicon chip were cured at 175° C. for 60 minutes, thereby adhering.

And further, using a sealing material (SUMICON EME-G700, a product of Sumitomo Bakelite Co., Ltd.), the resultant adhered product was sealed to produce a semiconductor device.

The resultant semiconductor device was subjected to a moisture adsorption treatment under a condition of at 30° C., relative humidity of 60%, for 168 hours, thereafter the resultant semiconductor device was subjected to IR reflow treatment (at 260° C., for 10 sec., 3 times reflowing). With respect to the resultant semiconductor device, degree of exfoliation was determined by a supersonic flaw detection device (a permeation type). If the percentage of exfoliated area to a chip is less than 10%, then it is graded as pass. Semiconductor device: QFP (14×20×2.0 mm)
leadframe: A copper leadframe on which silver spot plating was effected.
chip size: 5×5 mm
Curing condition of the resin composition: in an oven kept at 175° C., for 60 minutes
○: The exfoliated area to the area of a silicon chip is less than 5%.
Δ: The exfoliated area to the area of a silicon chip is not less than 5% and less than 10%.
X: The exfoliated area to the area of a silicon chip is more than 10%.
(Calculation method of C, C1 and C2)

Using each of the resin compositions of Examples and Comparative Examples, the following leadframe and silicon chip were cured at 175° C. for 60 minutes, thereby adhering.

From the resultant adhered product, a cross-section of the adhesive layer 1 was cut off to obtain an SEM cross-sectional view of the adhesive layer 1 in the thickness direction. The resultant SEM cross-sectional view was subjected to binarize process. In the binarize process, the threshold was set to be the volume fraction X of the conductive filler contained in the cured product obtained from the ash measurement of cured product of paste. Subsequently, the binarized image obtained by the binarize process was cut in the thickness direction at 0.2 μm intervals, thereby calculating the content of thermal conductive filler 8 of each of the layers. At first, from the upper part to the lower part, the content of up to Nth layer was calculated. That is, it was calculated, as the silver ratio of the 1st layer=(silver amount of the 1st layer/X)×100, the silver ratio of from the 1st layer to the 2nd layer=(silver amount of the 1st layer+silver amount of the 2nd layer)/X×100, ..., the silver ratio of from the 1st layer to the Nth layer= (silver amount of the 1st layer+silver amount of the 2nd layer+ ... +silver amount of the Nth layer)/X×100=(X/X)× 100=100. Similarly, (2) the content from the lower part to the upper part was calculated. That is, it was calculated, as the silver ratio of the 1'st layer=(silver amount of the 1'st layer/ X)×100, the silver ratio of from the 1'st layer to the 2'nd layer=(silver amount of the 1'st layer+silver amount of the 2'nd layer)/X×100, ..., the silver ratio of from the 1'st layer to the N'th layer=(silver amount of the 1'st layer+silver amount of the 2'nd layer+ ... +silver amount of the N'th layer)X×100=(X/X)×100=100. As for C1/C in the region 1 ranging from the interface of the semiconductor 3 side to a depth of 2 μm of the adhesive layer 1, (1) the silver ratio of the first layer calculated from the upper part to the lower part was adopted. On the other hand, as for C2/C in the region 2 ranging from the interface of the base material (die pad 2) side to a depth of 2 μm of the adhesive layer 1, (2) the silver ratio of the 1'th layer calculated from the lower part to the upper part was adopted.
(Heat Cycle (Adhesiveness))

Using each of the resin compositions of Examples and Comparative Examples, the following leadframe and silicon chip were cured at 175° C. for 60 minutes, thereby adhering.

With respect to the resultant adhered product, heat cycle treatment (25° C./160° C. for 30 minutes was determined as 1 cycle) was performed.

At every 10 cycles performed, it was confirmed whether exfoliation is generated or not between the chip and the adhesive layer, and whether exfoliation is generated or not between the leadframe and the adhesive layer.

When there is no exfoliation between the chip and the adhesive layer, and there is no exfoliation between the leadframe and the adhesive layer, it is indicated as O/O.

When there is exfoliation between the chip and the adhesive layer, and there is no exfoliation between the leadframe and the adhesive layer, it is indicated as X/O.

When there is no exfoliation between the chip and the adhesive layer, and there is exfoliation between the leadframe and the adhesive layer, it is indicated as O/X.

When there is exfoliation between the chip and the adhesive layer, and there is exfoliation between the leadframe and the adhesive layer, it is indicated as X/X.

[Table 1]

In Examples, it is conformed that the region having low content of the thermal conductive filler 8 is formed on both sides of the adhesive layer 1.

As a result, it revealed that each of Examples excels in both reflow-resistance and heat cycle performance. On the other hand, it revealed that each of Comparative Examples is poor at both reflow-resistance and heat cycle performance. In addition, when monodispersed spherical alumina having 10 μm of maximum particle size of particle size distribution was used instead of silver powder in Example 1, similar result as Example 1 was obtained.

It should be noted that, it is course, afore-mentioned embodiments and plural deformation can be combined with each other, as far as the contents of which are not contrary to each other. In addition, in the embodiment and a deformation example, constitution of each part were explained concretely, but the constitutions can be changed as far as they satisfy the present invention.

INDUSTRIAL APPLICABILITY

According to the present invention, a semiconductor device having an excellent yield is provided, and hence the present invention is extremely useful.

DENOTATION OF REFERENCE NUMERALS

1 adhesive layer,
2 die pad,
3 semiconductor element,
4 lead,
5 sealing layer,
6 bonding wire,
7 pad,
8 thermal conductive filler,
10 semiconductor device.

TABLE 1

| | | Examples | | | | | | | Comparative Examples | | |
|---|---|---|---|---|---|---|---|---|---|---|---|
| | | 1 | 2 | 3 | 4 | 5 | 6 | 7 | 1 | 2 | 3 |
| Silver powder | FA-SSB-112 (DOWA ELECTRONICS Co., Ltd.) | 520.0 | 520.0 | 520.0 | | | | | | | |
| | AG-SSB-114 (DOWA ELECTRONICS Co., Ltd.) | | | | 520.0 | 520.0 | 520.0 | 450.0 | | 120.0 | 300.0 |
| | HKD-12 (FUKUDA KINZOKUHAKU KOGYO Co., Ltd.) | | | | | | | 70.0 | 520.0 | 400.0 | 220.0 |
| Epoxy resin | SB-403S (NIHON KAYAKU C., Ltd.) | 50.0 | 50.0 | 50.0 | 50.0 | 50.0 | 50.0 | 50.0 | 50.0 | 50.0 | 50.0 |
| | m, p-CGE (SAKAMOTO YAKUHIN KOGYO Co., Ltd.) | 30.0 | 30.0 | 30.0 | 30.0 | 30.0 | 30.0 | 30.0 | 30.0 | 30.0 | 30.0 |
| Hardener | DIC-BPF (DIC Co., Ltd.) | 10.0 | 10.0 | 10.0 | 10.0 | 10.0 | 10.0 | 10.0 | 10.0 | 10.0 | 10.0 |
| | 2P4MHZ (SHIKOKU KASEI KOGYO Co., Ltd.) | 1.0 | 1.0 | 1.0 | 1.0 | 1.0 | 1.0 | 1.0 | 1.0 | 1.0 | 1.0 |
| | EH-3636AS (ADEKA Co., Ltd.) | 1.0 | 1.0 | 1.0 | 1.0 | 1.0 | 1.0 | 1.0 | 1.0 | 1.0 | 1.0 |
| Sinking test | | O | O | O | O | O | O | O | X | X | X |
| C/% | | 57.4 | 57.2 | 57.5 | 57.1 | 57.6 | 57.3 | 57.3 | 57.3 | 57.2 | 57.5 |
| C1/C | | 0.88 | 0.90 | 0.91 | 0.90 | 0.90 | 0.92 | 0.80 | 0.51 | 0.64 | 0.73 |
| C2/C | | 0.93 | 0.91 | 0.93 | 0.93 | 0.93 | 0.93 | 0.99 | 1.31 | 1.18 | 1.08 |
| L/μm | | 11 | 19 | 150 | 10 | 10 | 21 | 18 | 20 | 17 | 20 |
| Reflow resistance (Peeled area) | | O | O | O | O | O | O | Δ | X | X | O |
| Heat cycle (adherence) | | O/O | O/O | O/O | O/O | O/O | O/O | O/O | X/O | X/O | X/O |

The invention claimed is:

1. A semiconductor device, comprising:
   a base material,
   a semiconductor element, and
   an adhesive layer consisting of a cured die attach paste, intervening the space between the base material and the semiconductor element to adhere the base material and the semiconductor element, wherein thermal conductive filler is dispersed in the adhesive layer, wherein when the content of the thermal conductive filler dispersed in the whole of the adhesive layer is expressed as C, the content of the thermal conductive filler in the region 1 ranging from the interface of the adhesive layer at the side of the semiconductor element to the depth by 2 μm is expressed as C1, and the content of the thermal conductive filler in the region 2 ranging from the interface of the adhesive layer at the side of the base material to the depth by 2 μm is expressed as C2, the following formulae are satisfied:

$C1<C$, and $C2<C$; and wherein the semiconductor device is a wire-bonding type semiconductor device.

2. The semiconductor device as set forth in claim 1, wherein the thermal conductive filler contains at least one kind of particle selected from the group consisting of silver, copper, gold, aluminum, nickel, alumina and silica.

3. The semiconductor device as set forth in claim 1, wherein the base material is a leadframe, a heat sink or a BGA substrate.

4. The semiconductor device as set forth in claim 1, wherein the semiconductor element is a power device having electric power consumption of 1.7 W or more.

5. The semiconductor device as set forth in claim 1, wherein the thermal conductive filler contains at least one kind of particle selected from the group consisting of silver, copper, gold, aluminum, and nickel.

6. A semiconductor device, comprising:
a base material,
a semiconductor element, and
an adhesive layer consisting of a cured die attach paste, intervening the space between the base material and the semiconductor element to adhere the base material and the semiconductor element, wherein thermal conductive filler is dispersed in the adhesive layer, wherein when the content of the thermal conductive filler dispersed in the whole of the adhesive layer is expressed as C, the content of the thermal conductive filler in the region 1 ranging from the interface of the adhesive layer at the side of the semiconductor element to the depth by 2 μm is expressed as C1, the content of the thermal conductive filler in the region 2 ranging from the interface of the adhesive layer at the side of the base material to the depth by 2 μm is expressed as C2, the following formulae are satisfied:

$0.75<C1/C<0.97$, and $0.75<C2/C<0.97$; and wherein the semiconductor device is a wire-bonding type semiconductor device.

7. The semiconductor device as set forth in claim 6, wherein the thermal conductive filler contains at least one kind of particle selected from the group consisting of silver, copper, gold, aluminum, nickel, alumina and silica.

8. The semiconductor device as set forth in claim 6, wherein the base material is a leadframe, a heat sink or a BGA substrate.

9. The semiconductor device as set forth in claim 6, wherein the semiconductor element is a power device having electric power consumption of 1.7 W or more.

10. The semiconductor device as set forth in claim 6, wherein the thermal conductive filler contains at least one kind of particle selected from the group consisting of silver, copper, gold, aluminum, and nickel.

* * * * *